United States Patent [19]

Yamashita

[11] Patent Number: 4,769,790
[45] Date of Patent: Sep. 6, 1988

[54] MATRIX DATA TRANSPOSER

[75] Inventor: Jun Yamashita, Saitama, Japan

[73] Assignee: Fuji Xerox Co., Ltd., Tokyo, Japan

[21] Appl. No.: 890,918

[22] Filed: Jul. 30, 1986

[30] Foreign Application Priority Data

Aug. 13, 1985 [JP] Japan ............................... 60/177002

[51] Int. Cl.$^4$ ............................................ G11C 13/00
[52] U.S. Cl. ..................................... 365/189; 365/76; 365/238
[58] Field of Search ................. 365/189, 230, 238, 73, 365/76

[56] References Cited

U.S. PATENT DOCUMENTS 3,763,480 10/1973 Weimer ................................ 365/189
3,969,706 7/1976 Proebsting et al. .................. 365/230

Primary Examiner—Terrell W. Fears
Attorney, Agent, or Firm—Finnegan, Henderson, Farabow, Garrett and Dunner

[57] ABSTRACT

A matrix data transposer is disclosed which allows data stored in a matrix format to be transposed at high speed using parallel processing techniques. In one embodiment, the data are passed through a time delay means which delays each bit of a word a different amount. The time delayed data are then passed through a distribution means which operates to shift the data in position from rows to columns. The shifted data are then passed through a second time delay means to restore the data to its original timing, the end result being the data transposed so that what was originally one row of the data matrix is now one column of the matrix. A second embodiment achieves the same result using only one time delay means and two distribution means.

7 Claims, 11 Drawing Sheets

MATRIX DATA TRANSPOSER

BACKGROUND OF THE INVENTION

The present invention relates to a matrix data transposer and method for transposing matrix data composed of N signal columns each having M signals (M rows) in accordance with a predetermined relationship and then outputting the transposed matrix data.

In information processing equipment or the like, recombination or rearrangement of data having a predetermined relationship has often been performed.

For example, various kinds of printers utilizing an LED array, a multistylus head, a thermal head or the like (hereinafter generically referred to as "array heads") as a system for recording digitized picture information on recording paper have been put to practical use and data transferred to the printer is often rearranged.

Such an array head, in general, performs the recording of picture information onto an electrostatic thermal recording medium by recording a line consisting of black and white dots in each recording operation.

Picture signals for one line are supplied to the array head for each recording operation. The picture signals, or data bits, consist of thousands of binary digits "0" and "1," which are used for recording the white and black dots, respectively. If the data bits are transferred to the array head in series, the transfer time may be lengthy. This lengthy transfer time is an obstacle to high-speed recording operations.

To solve this problem, as shown in FIG. 1, a plurality of shift registers 2 (eight shift registers are shown in FIG. 1), each capable of storing a predetermined quantity of data bits are often provided in the array head 1 to thereby hold and transfer data bits 3 which represent one line of a picture to be printed. In FIG. 1, the data bits 3 are separated into predetermined quantities of eight parts, extracted as shown by the arrows 4, and transferred to the respective shift registers 2. If the data bits 3 are transferred as shown by the arrows 4, the data bits stored in the shift registers have the same arrangement in shift registers 2 as before the transfer. However, the transfer speed in this case is eight times as fast as the transfer speed when the data bits are supplied serially through a single line.

For example, as shown in FIG. 2, data bits representative of a line to be printed are stored in a memory 5 and may be selected in the required order, stored in a single shift register $5_1$ capable of storing eight groups of data bits, and then transferred in parallel to the shift registers 2 of the array head from the shift register $5_1$ as described alone with respect to FIG. 1. This procedure is then repeated for each line to be printed.

Assume that one line of a picture signal is composed of 4096 data bits, that the data bits are numbered from "0" to "4095"; and that the data bits are transferred as described above. First, the data bits are stored in random-access memory elements or the like, and partitioned into eight groups, "0" to "511," "512" to "1023," "1024" to 1535," "1536" to "2047," "2048" to "2559," "2560" to "3071," "3072" to "3583," and "3584" to "4095." The data bits are then successively transferred to the shift register $5_1$ in numerical order from the first to the last of each group. That is, data bits "0," "512," "1024," "1536," "2048," "2560," "3072" and "3584" are successively picked up in order and transferred in series to each of the shift registers, whereafter data bits "1," "513," "1025" . . . , are transferred and finally data bits . . . "3071," "3585" and "4095" are transferred in the same manner to thus perfect the transfer and processing of the data.

Such data transposition processing has been applied not only to apparatus using thermal heads but also various other apparatus. For example, the serially transferred data may be stored in a random-access memory (RAM) in a certain order by address, and then, if the data is required in another order, the data may be read out of the RAM in that designated order.

However, such processing requires the double procedure of writing all the data bits into the storage element bit by bit and reading out the data bit by bit, resulting in an obstacle to high-speed processing. In addition, the data must be temporarily stored in the shift register $5_1$, as shown in FIG. 2, which causes delay in data transfer time.

It is known to be efficient to write and read data by means of a microprocessor or the like, word by word (for example, eight bits by eight bits), as opposed to bit by bit. FIG. 3 illustrates such a system.

The system shown in FIG. 3 is arranged to receive data bits read out in parallel, eight bits at a time, from a memory 10 in which the data bits have been stored, transpose the data in accordance with a predetermined transposition relationship, and output the transposed data onto parallel output lines 11. The operational principle of the system is shown in FIG. 4.

In FIG. 4, data bits 3 representing one line to be printed are partitioned into eight groups of data bits $L_1$ to $L_8$. The data bits are read out word by word (for example, eight bits at a time) successively from the top of each of the groups, from W1 to W2, W3, . . . W8. After the reading of the first group of data bits, the next group of data bits is again read out word by word. The procedure is repeated until all data has been transferred. The eight bit data words are transmitted to a matrix data transposer 13 through eight-bit parallel transmission lines 12. The transposer 13 transposes the parallel data into serial data word by word and transfers the transposed data in parallel to the shift registers 2 (for example, eight shift registers provided in a thermal head, as shown in FIG. 1). As this procedure is repeated, the data bits 3 are partitioned into eight parts and transferred into the eight shift registers 2. With this system, it is possible to perform high-speed processing because the data are read and processed word by word, rather than bit by bit.

Referring again to FIG. 3, the matrix data transposer 13 (of FIG. 4) has addressable latches 17 ($17_{11}$ to $17_{18}$, $17_{01}$ to $17_{08}$) for storing input data in response to address signals 16, the latches being arranged at the input side as well as the output side, the input side latches being of the same number as the parallel input data line 12 and the output side latches being of the same number as the parallel output data line 11. In this drawing, the input lines 12 as well as the output lines 11 are shown as being eight in number, respectively, for the sake of convenience.

For example, when eight words each having eight bits are continuously input through the parallel input lines, the respective top bits of the eight words are latched, for example in the uppermost addressable latch $17_{11}$. Similarly, the respective second bits of the words are successively latched in the next addressable latch $17_{12}$. Thus, the eight words are distributed bit by bit to the addressable latches $17_{11}$ to $17_{18}$. Next, the stored data in addressable latch $17_{11}$ are successively distributed bit by bit to the output side addressable latches $17_{01}$ to $17_{08}$, so that the respective top bits of the words are stored in the respective top addresses of the output side addressable latches 17. Similarly, data are distributed successively from each of the other input side addressable latches $17_{12}$ to $17_{18}$ to the output side addressable latches $17_{01}$ to $17_{08}$. Thus, the respective words are stored one by one in the respective output side addressable latches $17_{01}$ to $17_{08}$. When the stored words are read out, they are output in parallel onto the output lines 11. The input/output operation is the same as that described above with reference to FIG. 4.

Using data processing techniques such as those described above, it is possible to read and transfer data efficiently. However, the above-described data transposer cannot begin to output signals before a predetermined number of words have been stored in the respective addressable latches. Therefore, in the conventional transposer, this is a limit in processing speed.

SUMMARY OF THE INVENTION

It is therefore an object of the present invention to improve the above-discussed prior art data processing systems by providing a system which processes the data more quickly.

It is another object of the present invention to provide a matrix data transposer which can speedily transpose parallel input data and output that data onto parallel output lines.

To attain the foregoing objects, according to one aspect of the present invention, the matrix data transposer comprises N input lines for receiving N parallel data streams each constituted by M bits of data, time delay means for delaying the bits of each of the N data streams for a different time period, and distribution means for distributing the M bits of each of the N data streams to M output lines, the N input lines, the time delay means, and the distribution means being connected in series. Preferably, the delay means is connected between the distribution means and the input lines.

According to another preferred embodiment, the distribution means is connected between a first time delay means and a second time delay means, so that the distribution means receives the respective N parallel data streams delayed by the first time delay means and transposes the M bits of data forming the N parallel data streams every time one group of the data bits is input, and the second time delay means delays the N parallel data stream received from the distribution means so as to output the transposed data bits simultaneously onto corresponding output lines.

According to a further embodiment of the present invention, a time delay means is connected between a first distribution means and a second distribution means, so that the first distribution means receives the respective N parallel data streams input through N input lines, transposes the data bits forming each data stream each time one group of the data bits is input. The time delay means then delays the respective N parallel data streams, and the second distribution means receives the respective N parallel data streams input thereto at different timings and shifts all the data bits forming every parallel data stream every time one of the signals is input.

As described above, when the respective data streams are time delayed by the delay means and transposed by one by the distribution means, the respective data streams are transposed and output as shown in FIG. 4.

In this case, although the first word in each of the data streams is output after a time delay caused by the delay means, the remaining input data words are output after being transposed. Accordingly, it is possible to appreciably shorten the time required for signal processing compared to the prior art.

DESCRIPTION OF THE PREFERRED EMBODIMENTS

The principle of operation of a matrix data transposer constructed according to the present invention will be described in detail with reference to FIGS. 5a through 5d and 6a through 6d.

Figure 5A:
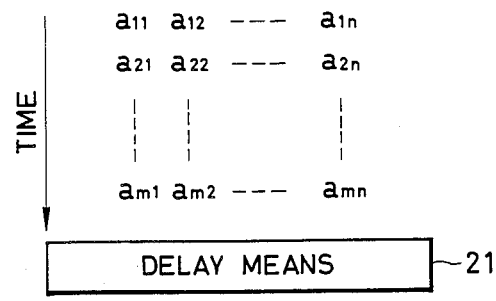
FIGS. 5a through 5d are schematic diagrams helpful in explaining the principle of operation of the matrix data transposer according to one embodiment of the present invention.
Figure 5B:
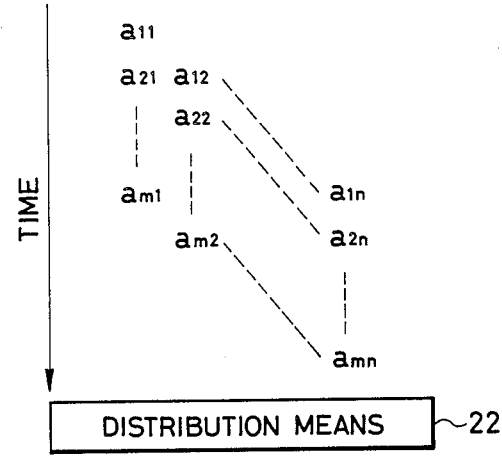
Figure 5C:
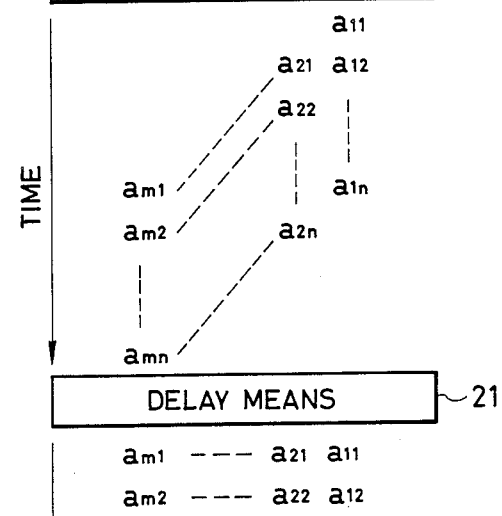
Figure 5D:
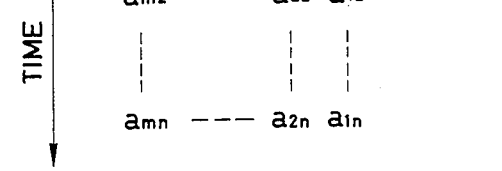

FIG. 5a shows that N signal columns, or data streams, $a_{11}$ to $a_{m1}$, $a_{12}$ to $a_{m2}$, ... $a_{1n}$ to $a_{mn}$ are input in parallel through N input lines. In this case, N=n. The respective signal columns are time shifted by delay means 21 as shown in FIG. 5b. That is, each data stream is delayed so that it will be transmitted at a delayed timing with respect to the data stream to its right in the drawing. Next, the data streams are transposed by distribution means 22 so that the data bits from each column are located in rows i.e., the data matrix shown in FIG. 5a is transposed as shown in FIG. 5c. The data signals are output from the distribution means while being transposed in position whenever one of the data signals is input. For example, referring to signals $a_{1n}$ to $a_{mn}$, these signals are grouped in parallel in one row and output in the order from $a_{mn}$ to $a_{1n}$, as shown in FIG. 5c. Thereafter, the respective data signals are time shifted again by the delay means 21 so that the signals are output at the same time. The last time delay means 21 is not required if it is unnecessary to adjust the output timing of the respective signals.

The present invention can also be put into practice using another principle shown in FIGS. 6a through 6d.

Figure 1:
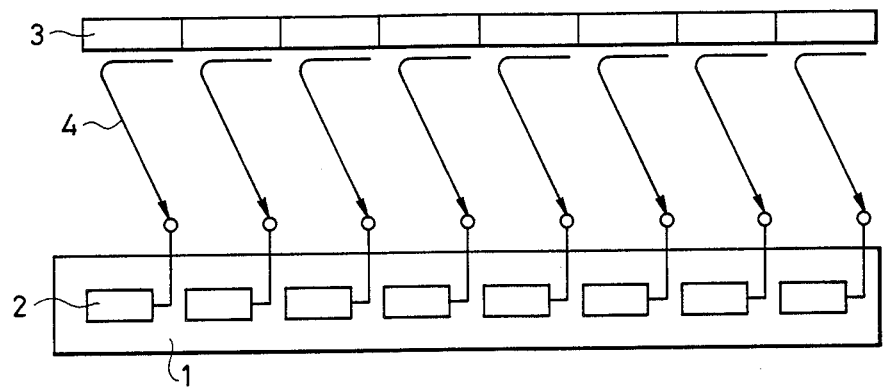
FIG. 1 is a diagram helpful in explaining the prior art principle of data transfer.
Figure 2:
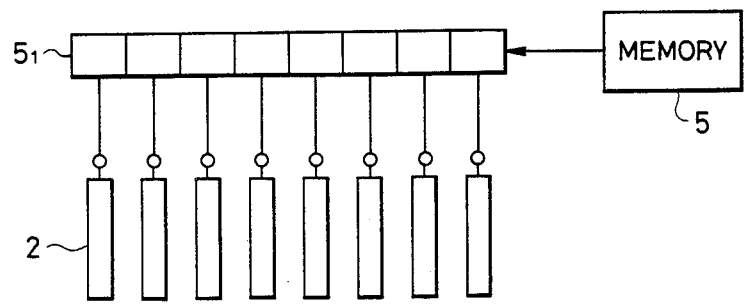
FIG. 2 is a block diagram of major components of a conventional data matrix transposer.
Figure 3:
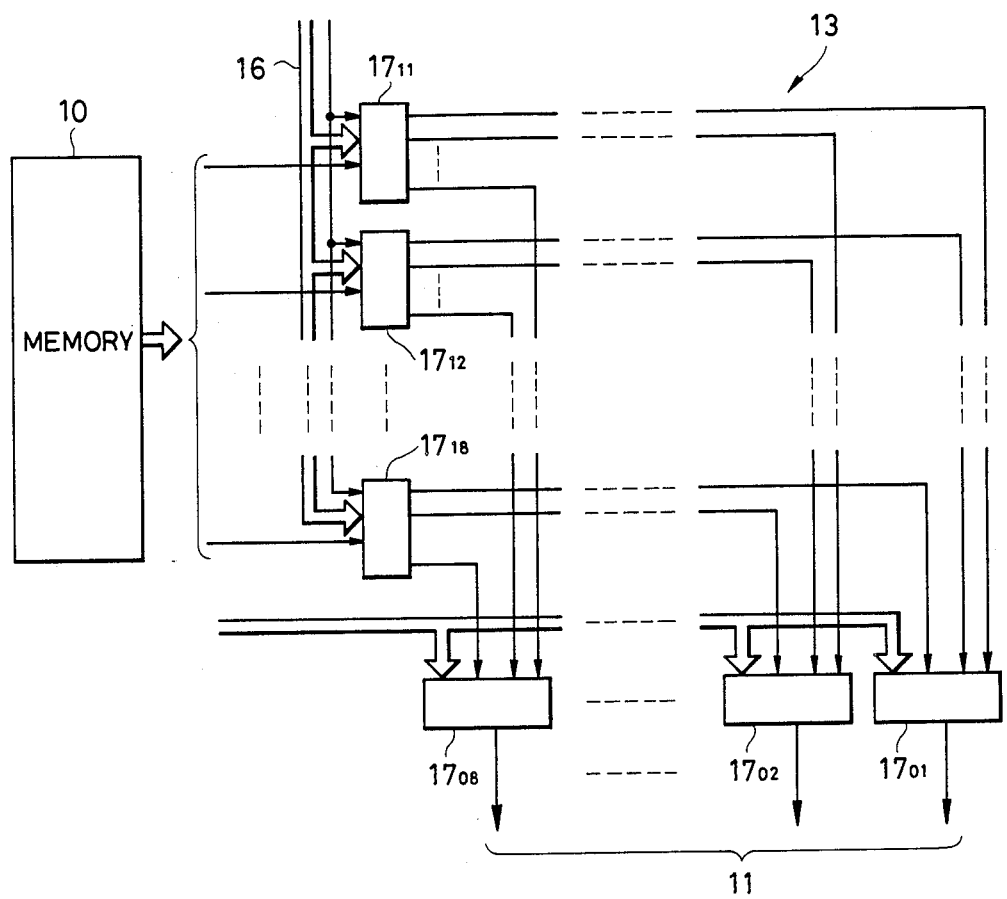
FIG. 3 is a block diagram of the major component parts of another conventional data matrix transposer.
Figure 6A:
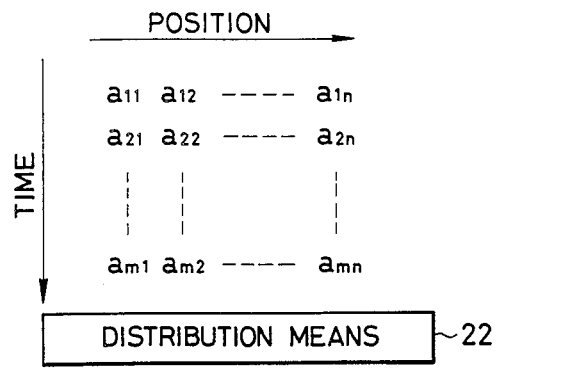
FIGS. 6a through 6d are schematic drawings helpful in explaining the principle of operation of the matrix data transposers according to another embodiment of the present invention.
Figure 6B:
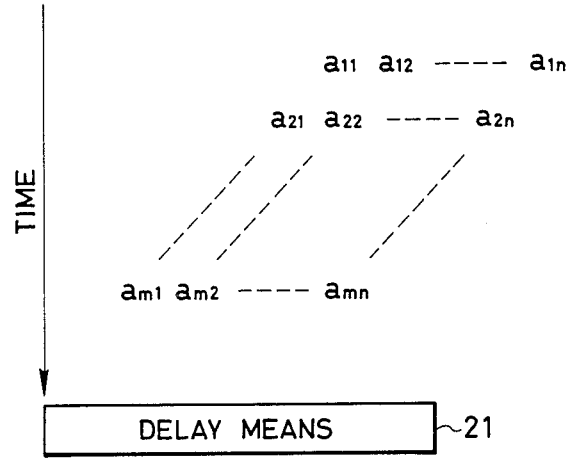
Figure 6C:
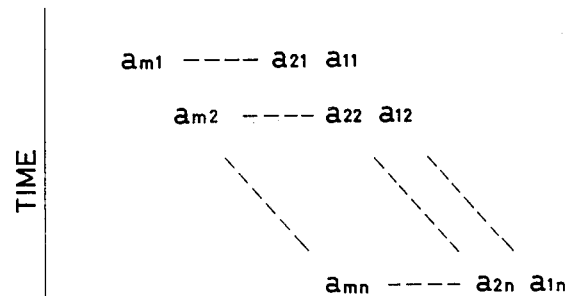
Figure 6D:
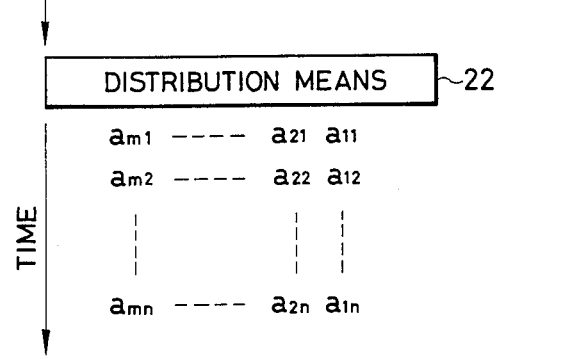

In FIGS. 6a through 6d, N groups of data streams are input in the manner as shown in FIG. 1a, shifted in position with respect to N or more parallel lines and then output on those lines. This procedure is carried out by the distribution means 22 (FIG. 2b). Next, the respective signals are time shifted by the delay means 21 (FIG. 6c). In this case, the delay processing is performed in such a manner that the first input data bit $a_{m1}$ is output last and the last input data bit $a_{1n}$ is output first. Next, these data are shifted again in position by the distribution means 22. According to this principle, transposed signals having the same organization as those shown in FIG. 5 can be output.

Figure 7:
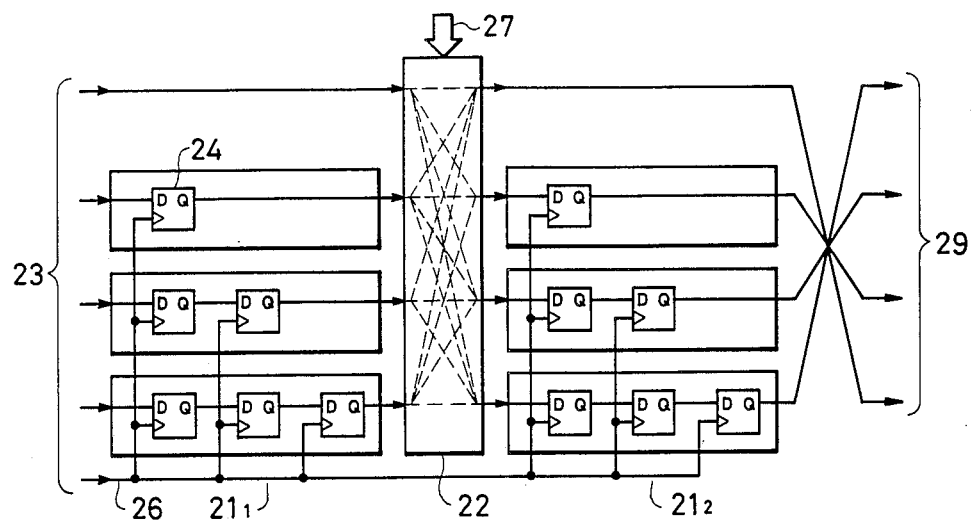
FIG. 7 is a schematic block diagram showing one embodiment of the present invention.
Figure 8A:
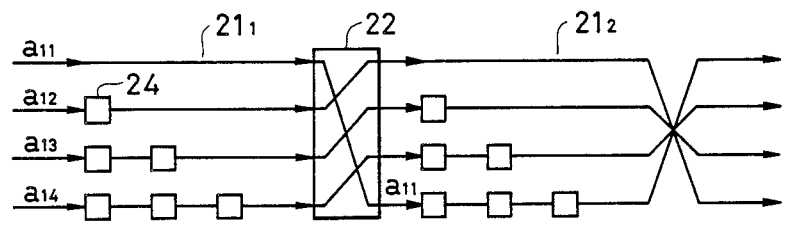
FIGS. 8a through 8g are schematic block diagrams helpful in explaining the transposing of data bits during the operation of the embodiment illustrated in FIG. 7.
Figure 8B:
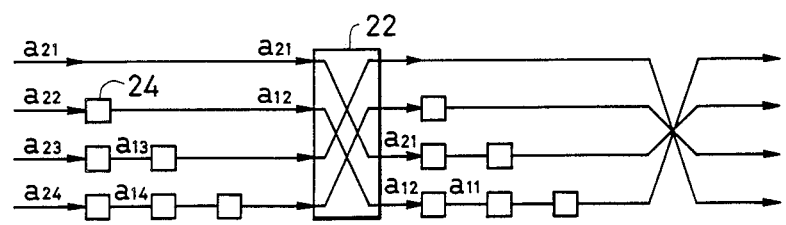
Figure 8C:
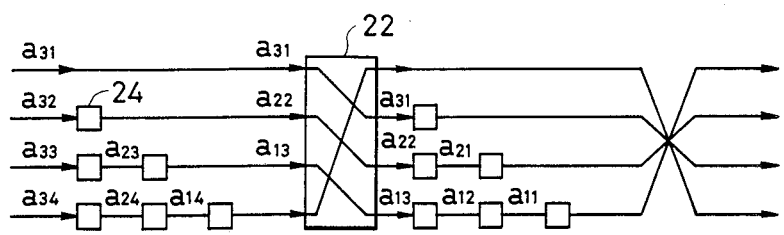
Figure 8D:
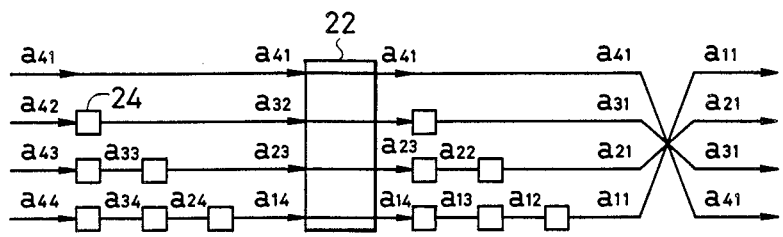
Figure 8E:
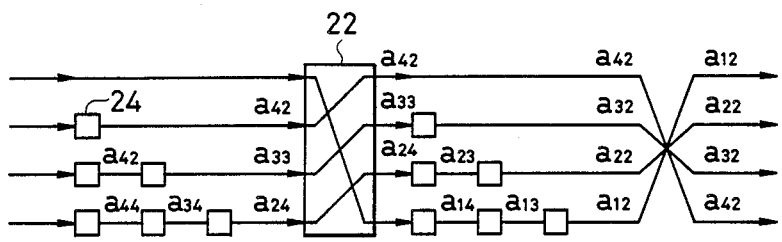
Figure 8F:
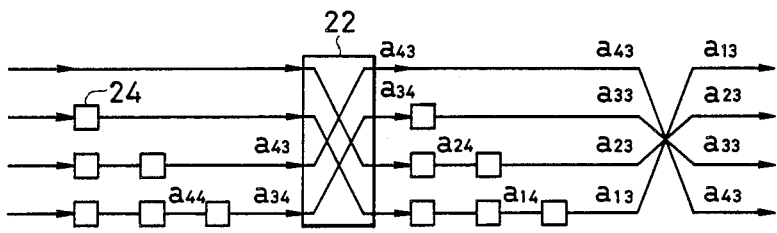
Figure 8G:
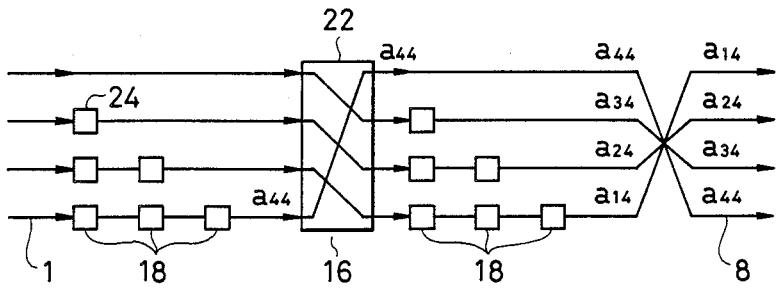

FIG. 7 is a block diagram showing an embodiment of the matrix data transposer of the present invention for carrying out the operation on the basis of the principle of FIGS. 5a through 5d.

In FIG. 7, input signals are arranged so that data signal columns each constituted by 4-bit signals are input through 4 parallel input lines 23.

In delay means $21_1$, uppermost input line 23 has nothing connected thereto; a second input line has one flip-flop circuit 24 inserted thereto; a third input line has two flip-flop circuits 24 connected thereto; and a fourth input line has three flip-flop circuits 24 connected thereto. The respective flip-flop circuits 24 operate to transmit input signals one by one to the output side in synchronism with clock signals on line 26. Distribution means 22 is a known element which can successively switch the connection between the input terminals and output terminals on the basis of shift-selection signals 27. Delay means $21_2$ having the same construction as delay means $21_1$ are connected to the output side.

This device operates as shown in FIGS. 8a through 8g. FIGS. 8a through 8g show the process of transposing input data expressed by the following matrix (I) into output data expressed by the following matrix (II) successively every time one clock signal is supplied to the device.

| (I)  | $a_{41}$ | $a_{31}$ | $a_{21}$ | $a_{11}$ |
|------|----------|----------|----------|----------|
|      | $a_{42}$ | $a_{32}$ | $a_{22}$ | $a_{12}$ |
|      | $a_{43}$ | $a_{33}$ | $a_{23}$ | $a_{13}$ |
|      | $a_{44}$ | $a_{34}$ | $a_{24}$ | $a_{14}$ |
| (II) | $a_{14}$ | $a_{13}$ | $a_{12}$ | $a_{11}$ |
|      | $a_{24}$ | $a_{23}$ | $a_{22}$ | $a_{21}$ |
|      | $a_{34}$ | $a_{33}$ | $a_{32}$ | $a_{31}$ |
|      | $a_{44}$ | $a_{43}$ | $a_{42}$ | $a_{41}$ |

When first signals $a_{11}$, $a_{12}$, $a_{13}$ and $a_{14}$ are input in parallel, a shifter 22 operates to shift $a_{11}$ to the lowermost line and shift the other signals to the upper lines by one line respectively. The signals $a_{12}$, $a_{13}$, and $a_{14}$ are stored into the respective first flip-flop circuits 24 of the delay means $21_1$. When next signals $a_{21}$, $a_{22}$, $a_{23}$ and $a_{24}$ are input, in response to a clock signal, the order of connection by the shifter 22 is changed. In this case, the upper two signals are shifted to the lower lines and the lower two signals are shifted to the upper lines. Accordingly, $a_{21}$ is output to the second line from the bottom. The signal $a_{12}$ having been stored in the flip-flop circuit 24 of the second line is output therefrom to the lowermost line. Thus, the shifter 22 shifts the order of connection between the input lines and output lines by one line in response to every clock signal so that the order of connection is returned to the original order after four clock signals (FIGS. 8a through 8e). The delay means $21_1$ delays the respective data signal columns by "0," "1," "2" and "3" clocks from the top and thereafter transmits the delayed signals into the distribution means 22. Accordingly, the time shifting shown in FIG. 5b is carried out and position shifting shown in FIG. 5c is carried out.

Thus, the necessary transposition of signals is completed, whereafter the delay means $21_2$ is used for the purpose of adjusting the output timing of the respective data signals. In FIGS. 8(d)–8(g), the positional relationship of the transposed signals is shown by crossing the output lines so that the relationship between the output data signals and input data signals may be easily understood. When the operations shown in FIGS. 8a to 8g are performed continuously, transposed data signals are output successively. Accordingly, processed data signals are output at the same time as data signals are input, and therefore matrix data transposing processing can be performed at a very high speed.

In the above-described embodiment, the transposing processing can be performed without problems even if the signal columns are input with no pause between data sets, because the signal columns comprised of four signals are input in parallel to the input lines. However, if the respective signal column is composed of three signals, an interval of one clock signal must be provided before succeeding signal columns are received to compensate for the missing data bit. Using this technique, the transposer can be used for transposing data columns smaller in number than the input lines. However, if the number of signals in each signal column is larger than the number of parallel input lines, the above described embodiment will not properly transpose the data.

Figure 9:
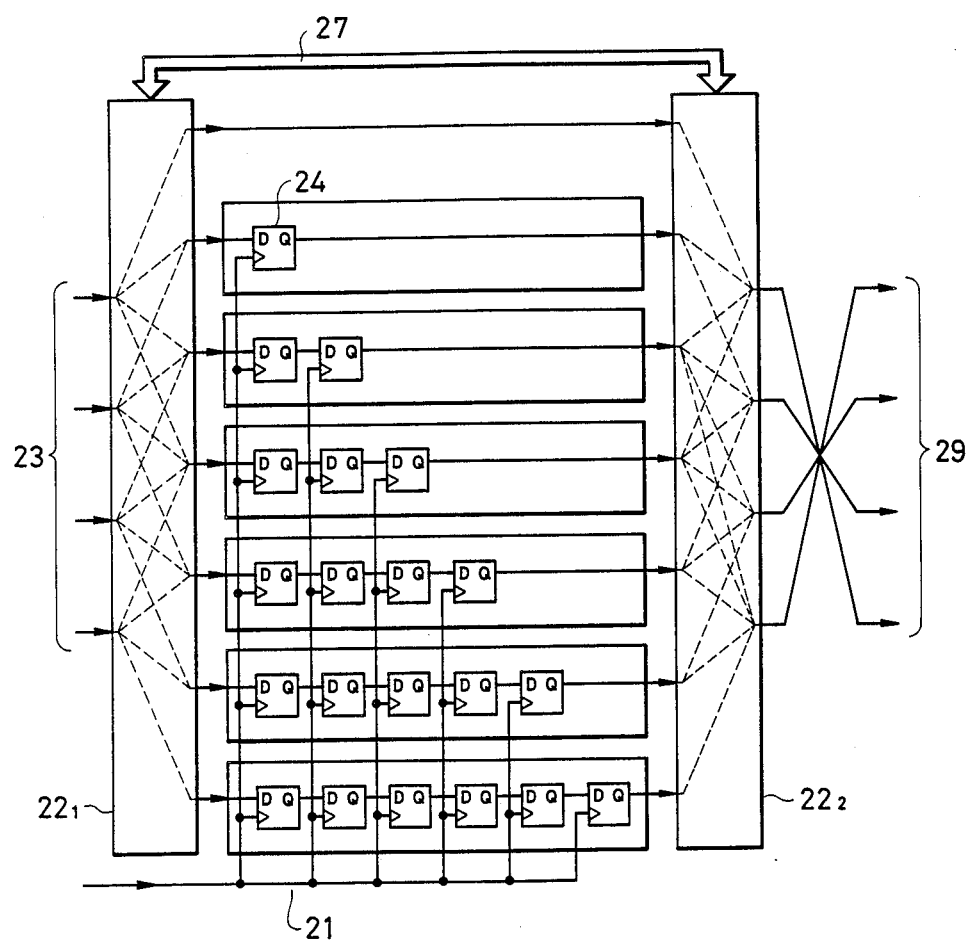
FIG. 9 is a schematic block diagram showing another embodiment of the invention.

FIG. 9 is a block diagram showing a second embodiment of the matrix data transposer of the present invention.

The transposer of this embodiment has shifters $22_1$ and $22_2$ symmetrically disposed on its input and output sides. The shifter $22_1$ provided at the input side has 4 input lines 23 and 7 output lines, while the shifter $22_2$ provided at the output side has 7 input lines and 4 output lines 29.

Flip-flop circuits 24, range from zero to six are connected between the two transposers as delay means 21. Data signals input through four parallel input lines 23 are position shifted by shifter $22_1$, and then time shifted by the delay means 21. The data signals are then again position shifted by the shifter $22_2$ provided at the output side, and are then output onto four output lines 29. The operational principle of this embodiment can be explained in the same manner as described above with reference to FIGS. 6a through 6d.

FIGS. 10a through 10g show the connection switching of the shifters $22_1$ and $22_2$ and the input timing of signals, successively, at every clock signal.

The shifter $22_1$ operates to shift the four input lines by one line with respect to the seven output lines successively with each clock pulse as shown in FIGS. 10a to 10g so that the connection order is returned to the original order after four clock signals. The data signals are temporarily stored in the flip-flop circuits of the delay means 21 in the same manner as described above with reference to FIG. 7, and then transmitted to the shifter $22_2$.

Figure 10A:
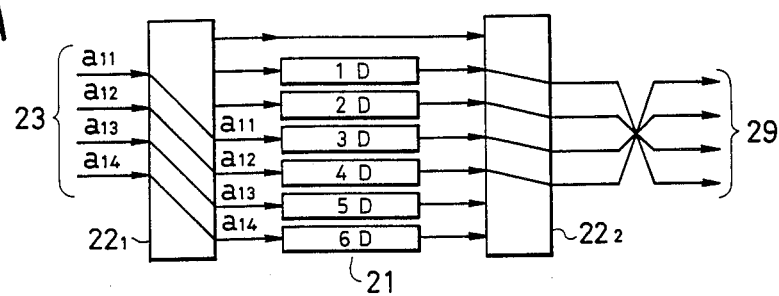
FIGS. 10a through 10g are schematic diagrams illustrating successive steps in transposing data during operation of the embodiment shown in FIG. 9.
Figure 10B:
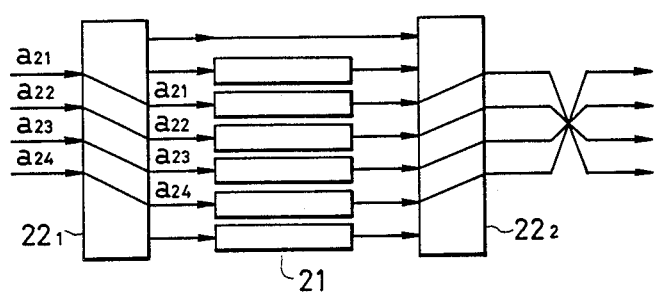
Figure 10C:
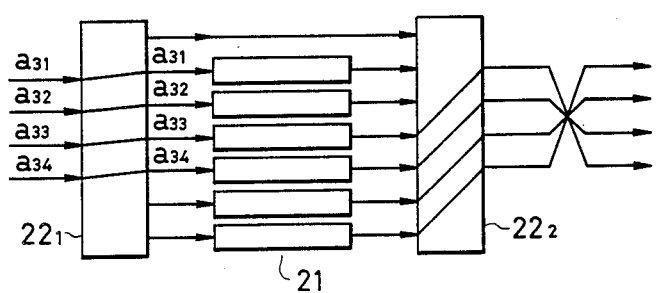
Figure 10D:
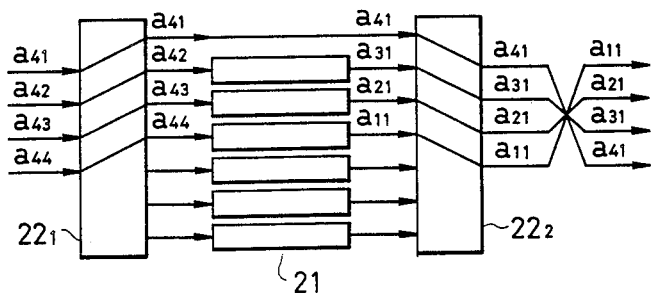
Figure 10E:
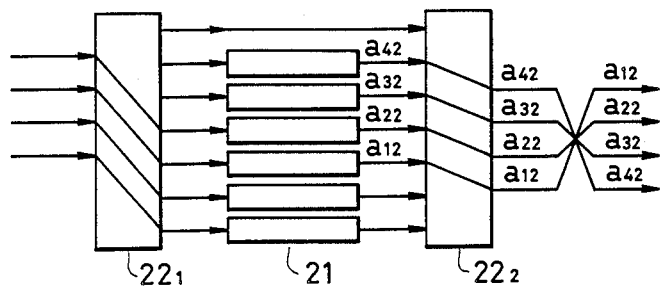
Figure 10F:
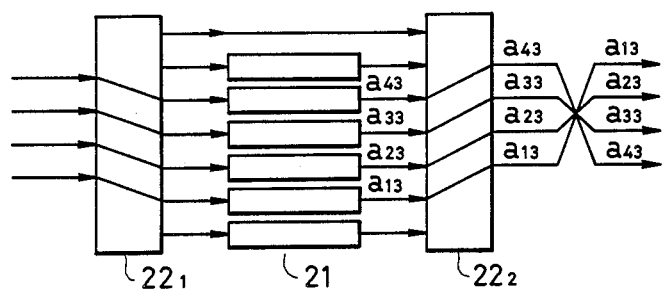
Figure 10G:
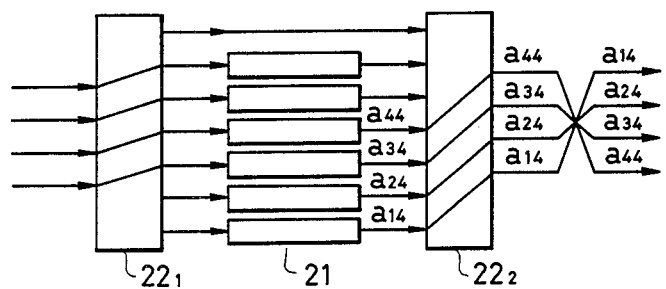

The shifter $22_2$, as shown in FIG. 10d, receives signals $a_{41}$, $a_{31}$, $a_{21}$ and $a_{11}$ as the first to be output, connects these signals to the output lines 29, and then shifts every connection by one line.

Thus, the same transposing processing as described above with reference to FIG. 7 is accomplished.

Figure 11:
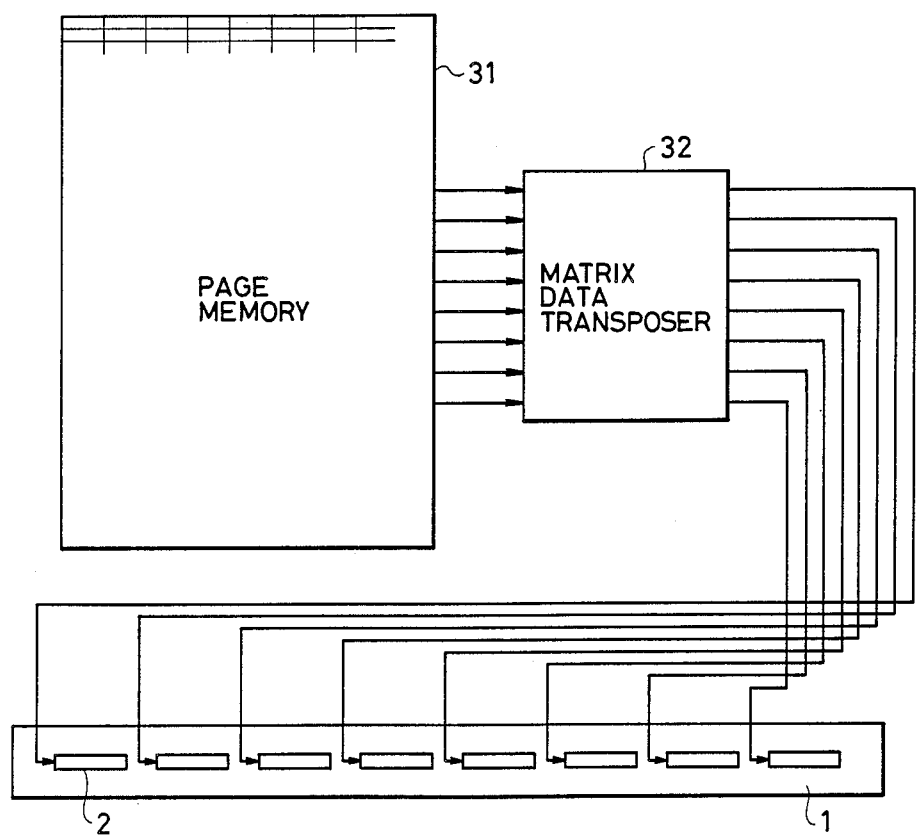
FIG. 11 is a block diagram showing a data processor using the matrix data transposer according to the present invention.

FIG. 11 is a block diagram showing a picture signal processor using a matrix data transposer according to the invention.

This picture signal processor comprises a page memory 31 for storing picture signals corresponding to picture information for one sheet, a matrix data transposer 32, and an array head 1. The array head 1 is provided with eight shift registers 2 as described above with reference to FIG. 1. The shift registers 2 are arranged in such a manner that the picture signals can be input in parallel from the matrix data transposer 32.

Figure 4:
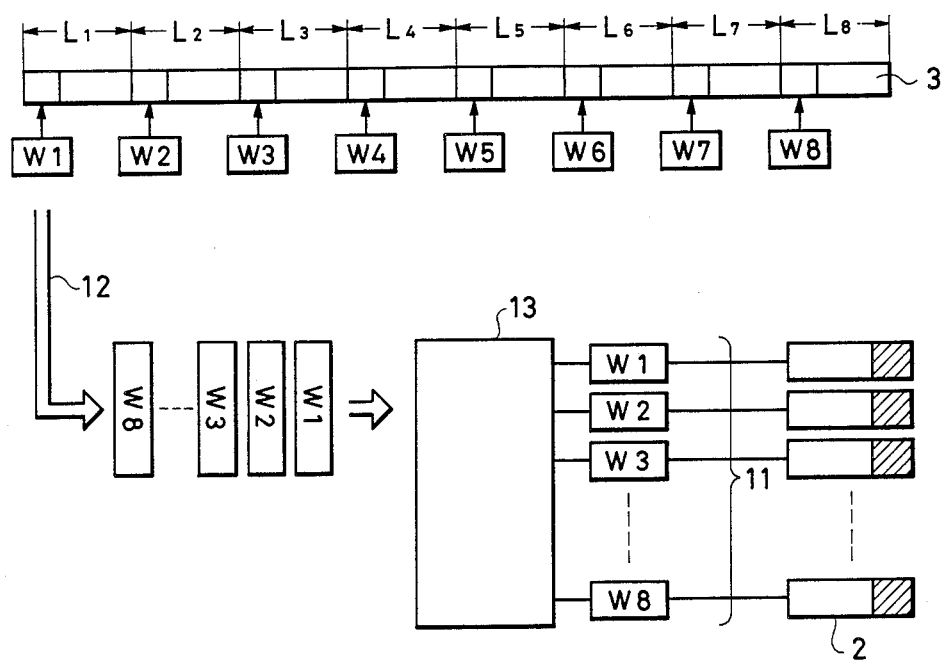
FIG. 4 is a diagram helpful in explaining the operating principle of a data processor for understanding the present invention.

In this picture signal processor, the picture signals are read out by eight bits at every reading operation, and the eight bit signals are input in parallel to the matrix data transposer 32. The reading operation of the picture signals is carried out in the order described above with reference to FIG. 4. The picture signals, having been transposed by the matrix data transposer 32 in the manner as described above with reference to FIG. 7 or FIG. 9, are stored in the corresponding shift registers 2, respectively. In the case where picture signals of every line are transferred as described above, the transfer speed can be made extremely high in comparison with the conventional processor. Accordingly, it is possible to increase recording speed or perform various other processes for the making picture quality higher.

The present invention is not limited to the specific embodiments described above. The delay means and distribution means may be suitably replaced by circuits or elements having equivalent functions. If necessary, the delay timing of the respective signal columns delayed by the delay means may be varied or the flip-flop circuits may be replaced by any other elements having delay functions.

The number of the input lines and output lines may be suitably selected. For example, in a case where the number of input data streams is larger than the number of the parallel input lines, it is possible to process the data streams if the output lines of the shifter are increased to equal the number of the input data streams.

Using the matrix data transposer of the present invention as described above, it is possible to carry out, at a high speed, signal processing for serially transposing parallel data signals and for transferring the transposed signals onto parallel output lines. Accordingly, it is possible to use the matrix data transposer widely where the transposition of signal arrangements or the like is required in various kinds of data processors.

What is claimed is:

1. A matrix data transposer comprising:
   N input lines for receiving N data streams each constituted by M data bits;
   time delay means for delaying each said data streams with different delay times for each bit of said data streams;
   distribution means for distributing said M data bits of each of said data streams to M output lines; and
   said N input lines, said delay means, and said distribution means being connected in series.

2. A matrix data transposer according to claim 1, in which said distribution means is connected between said delay means and said M output lines and arranged to receive said data streams delayed by said delay means and to shift in position all said M data bits forming each of said N data streams every time one of said M data bits is input into said matrix data transposer.

3. A matrix data transposer according to claim 1, which also includes a second time delay means, wherein said distribution means is connected between said first time delay means and said second time delay means, said distribution means being arranged to receive the respective N data streams delayed by said first time delay means and to shift in position all of said M data bits forming said N data streams upon the inputting of said M data bits, said second time delay means being arranged to delay the M data streams output from said distribution means so that said M data streams are output simultaneously onto said output lines.

4. A matrix data transposer according to claim 1, including a second distribution means, wherein said time delay means is connected between said first distribution means and said second distribution means, said first distribution means being arranged to receive the respective N data streams input through said N input lines, to shift the position of said M data bits forming said N data streams upon the inputting of said M data bits, said time delay means being arranged to delay said shifted N data streams, said second distribution means being arranged to receive said delayed, shifted N data streams at different timings and to shift in position said data bits forming said N data streams every time one of said data bits is input.

5. A method of transposing a matrix of data consisting of columns and rows of bits comprising:
   receiving in parallel a row of said bits;
   delaying each said bit of each said row for a different time period than the other said bits of said row;
   shifting the position of each of said bits in said row; and
   outputting in parallel the resultant transposed row of said data bits.

6. A method as in claim 5, wherein said bits are delayed for a second time after said bits are shifted in position.

7. A method of transposing a matrix of data consisting of columns and rows of bits comprising:
   receiving in parallel a row of said bits;
   shifting the position of each of said bits in said row;
   delaying each said shifted bit of each said row for a different time period than the other said bits of said row;
   shifting the position of each of the resultant delayed bits in said row; and
   outputting in parallel the resultant transposed row of said data bits.

* * * * *